United States Patent
Choi et al.

(10) Patent No.: US 8,471,594 B2
(45) Date of Patent: Jun. 25, 2013

(54) APPARATUS AND METHOD FOR OBTAINING MAXIMUM VALUE AND MINIMUM VALUE IN PLURALITY OF DIGITAL INPUT SIGNALS

(75) Inventors: Sung Woo Choi, Daejeon (KR); Woo Yong Lee, Daejeon (KR); Hyun Kyu Chung, Daejeon (KR)

(73) Assignee: Electronics & Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/339,394

(22) Filed: Dec. 29, 2011

(65) Prior Publication Data

US 2012/0169374 A1 Jul. 5, 2012

(30) Foreign Application Priority Data

Dec. 30, 2010 (KR) .................. 10-2010-0138518

(51) Int. Cl.
*H01L 25/00* (2006.01)

(52) U.S. Cl.
USPC ................................ 326/41; 326/47; 326/101

(58) Field of Classification Search
USPC .............................................. 326/37–47, 101
See application file for complete search history.

(56) References Cited

U.S. PATENT DOCUMENTS

| 4,967,349 | A | * | 10/1990 | Kodama et al. | ............... | 708/207 |
| 5,442,246 | A | * | 8/1995 | Azegami et al. | ............... | 326/38 |
| 2006/0098736 | A1 | * | 5/2006 | Guevorkian et al. | ...... | 375/240.12 |

* cited by examiner

*Primary Examiner* — Thienvu Tran
(74) *Attorney, Agent, or Firm* — Rabin & Berdo, P.C.

(57) ABSTRACT

The present invention relates to a digital signal processing circuit, and more particularly, to a method and apparatus for generating a maximum value or a minimum value used for designing the digital signal processing circuit. An apparatus for obtaining a maximum value or a minimum value from N digital input signals may include N×W bit processing elements to receive an input of W bits of each of the N digital input signals, W OR operators to receive an input of N operation values output from bit processing elements, and to perform an OR operation, respectively, and W inverters to invert an output value for each of the W OR operators.

9 Claims, 5 Drawing Sheets

FIG. 5

| PE | A8 | A7 | A6 | A5 | A4 | A3 | A2 | A1 | A0 |
|---|---|---|---|---|---|---|---|---|---|
| $W_i$ | 0 | 0 | 1 | 1 | 0 | 0 | 0 | 1 | 0 |
| $Q_i$ | 0 | 0 | 0 | 1 | 1 | 1 | 1 | 1 | 1 |
| $E_i$ | ① | ① | ⓪ | ⓪ | ⓪ | ⓪ | ⓪ | ⓪ | ⓪ |
| $Q_{i+1}$ | 0 | 0 | 1 | 1 | 1 | 1 | 1 | 1 | 1 |

| PE | B8 | B7 | B6 | B5 | B4 | B3 | B2 | B1 | B0 |
|---|---|---|---|---|---|---|---|---|---|
| $W_i$ | 0 | 0 | 0 | 0 | 1 | 0 | 1 | 1 | 1 |
| $Q_i$ | 0 | 0 | 0 | 0 | 0 | 0 | 0 | 0 | 0 |
| $E_i$ | ① | ① | ① | ① | ⓪ | ① | ⓪ | ⓪ | ⓪ |
| $Q_{i+1}$ | 0 | 0 | 0 | 0 | 0 | 0 | 0 | 0 | 0 |

| PE | 1 | 1 | 1 | 1 | 0 | 1 | 0 | 0 | 0 |
|---|---|---|---|---|---|---|---|---|---|
| Minimum value | 0 | 0 | 0 | 0 | 1 | 0 | 1 | 1 | 1 |

→ 'B'

APPARATUS AND METHOD FOR OBTAINING MAXIMUM VALUE AND MINIMUM VALUE IN PLURALITY OF DIGITAL INPUT SIGNALS

CROSS-REFERENCE TO RELATED APPLICATION

This application claims the benefit of Korean Patent Application No. 10-2010-0138518, filed on Dec. 30, 2010, in the Korean Intellectual Property Office, the disclosure of which is incorporated herein by reference.

BACKGROUND

1. Field of the Invention

The present invention relates to a digital signal processing circuit, and more particularly, to a method and apparatus for generating a maximum value or a minimum value used for designing the digital signal processing circuit.

2. Description of the Related Art

A conventional scheme for obtaining a maximum value or a minimum value in a digital system may obtain the maximum value or the minimum value between two values by subtracting one from another. The conventional scheme may determine a sign of a subtracted value to output the maximum value or the minimum value between the two values.

FIG. 1 is a diagram illustrating a configuration of a circuit for obtaining a minimum value of input bit signals according to a conventional art.

Referring to FIG. 1, in a conventional circuit configuration for obtaining a minimum value, to obtain a minimum value of, for example, four input bit signals, a subtracter and a multiplexer may operate in two stages to obtain the minimum value among the four input bit signals.

Conventionally, when a minimum value is obtained among N values, $\log_2 N$ stages may be used. When N does not correspond to a power of 2, $\log_2 N$ may not correspond to an integer multiple and thus, $\lceil \log_2 N \rceil$ stages may be used. Here, $\lceil \ \rceil$ denotes a round up function.

When a calculation is performed through several stages, a relatively long period of time may be expended, which may be inappropriate for a high-speed circuit design.

SUMMARY

An aspect of the present invention provides an apparatus and method that may resolve a complexity of performing a calculation through several stages when a relatively large number of populations is involved in obtaining a maximum value or a minimum value, and may obtain a result after a predetermined time delay irrespective of an increasing number of populations.

According to an aspect of the present invention, there is provided an apparatus for obtaining a maximum value or a minimum value from N digital input signals, the apparatus including N×W bit processing elements to receive an input of W bits of each of the N digital input signals, W OR operators to receive an input of N operation values output from bit processing elements, and to perform an OR operation, respectively, and W inverters to invert an output value for each of the W OR operators, respectively.

Each of the bit processing elements may include a NOR gate to perform a NOR operation on an $i^{th}$ bit value $W_i$ of a digital input signal, and a value $Q_i$ corresponding to an output value of an i+1$^{th}$ bit processing element that receives an input of an i+1$^{th}$ bit value $W_{i+1}$, and to output a value $E_i$ as a result of the NOR operation, an AND gate to perform an AND operation on a value $RE_i$ corresponding to an output value of one of the W OR operators that performs an OR operation in response to an input of the value $E_i$ output as a result of the NOR operation, and the $i^{th}$ bit value $W_i$ of the digital input signal, and an OR gate to perform an OR operation on the value $Q_i$ and an output value of the AND gate, and output a value $Q_{i-1}$ corresponding to an output value of the OR operation.

A value $Q_{i-1}$ output from a previous bit processing element may be input as the value $Q_i$ input to the NOR gate of a bit processing element that receives an input of an i−1$^{th}$ bit value $W_{i-1}$ of the digital input signal.

When the bit processing element is a bit processing element corresponding to a most significant bit of the digital input signal, a value equivalent to the $i^{th}$ bit value $W_i$ may be input as the value $Q_i$ input to the NOR gate.

According to another aspect of the present invention, there is provided a method of obtaining a maximum value or a minimum value from N digital input signals, the method including receiving an input of each bit of N×W bit processing elements that receive an input of W bits of each of the N digital input signals, outputting a value and a value $E_i$ operated in each of the bit processing elements, performing an OR operation on the value $E_i$ output from the bit processing elements that are at the same position of each digital input signal, and inverting a value obtained as a result of the OR operation.

The outputting may include outputting a value $E_i$ by performing a NOR operation on an $i^{th}$ bit value $W_i$ of a digital input signal, and a value $Q_i$ corresponding to an output value of an i+1$^{th}$ bit processing element, performing an AND operation on a value $RE_i$ output from W OR operators that perform an OR operation in response to an input of the value $E_i$ output as a result of the NOR operation, and the $i^{th}$ bit value $W_i$ of the digital input signal, and outputting a value $Q_{i-1}$ by performing an OR operation on the value $Q_i$ and an output value resulting from the AND operation.

A value $Q_{i-1}$ output from a previous bit processing element may be input to a NOR operator of a bit processing element that receives an input of an i−1$^{th}$ bit value $W_{i-1}$ of the digital input signal.

When the bit processing element is a bit processing element corresponding to a most significant bit of the digital input signal, a value equivalent to the $i^{th}$ bit value $W_i$ may be input as the value $Q_i$.

According to still another aspect of the present invention, there is provided a method of obtaining a maximum value or a minimum value from N digital input signals, the method including receiving an input of an inversion of each bit of N×W bit processing elements that receive an input of W bits of each of the N digital input signals, outputting a value $Q_{i-1}$ and a value $E_i$ operated in each of the bit processing elements, and performing an OR operation on the value $E_i$ output from the bit processing elements that are at the same position of each digital input signal.

According to an embodiment of the present invention, it is possible to perform a fast process by easing a delay, in a digital circuit, for obtaining a minimum/maximum value from a plurality of input signals.

BRIEF DESCRIPTION OF THE DRAWINGS

These and/or other aspects, features, and advantages of the invention will become apparent and more readily appreciated from the following description of exemplary embodiments, taken in conjunction with the accompanying drawings of which:

FIG. 5 is a diagram illustrating a table of data values output according to an operation for obtaining a minimum value according to embodiments of the present invention.

DETAILED DESCRIPTION

Figure 1:
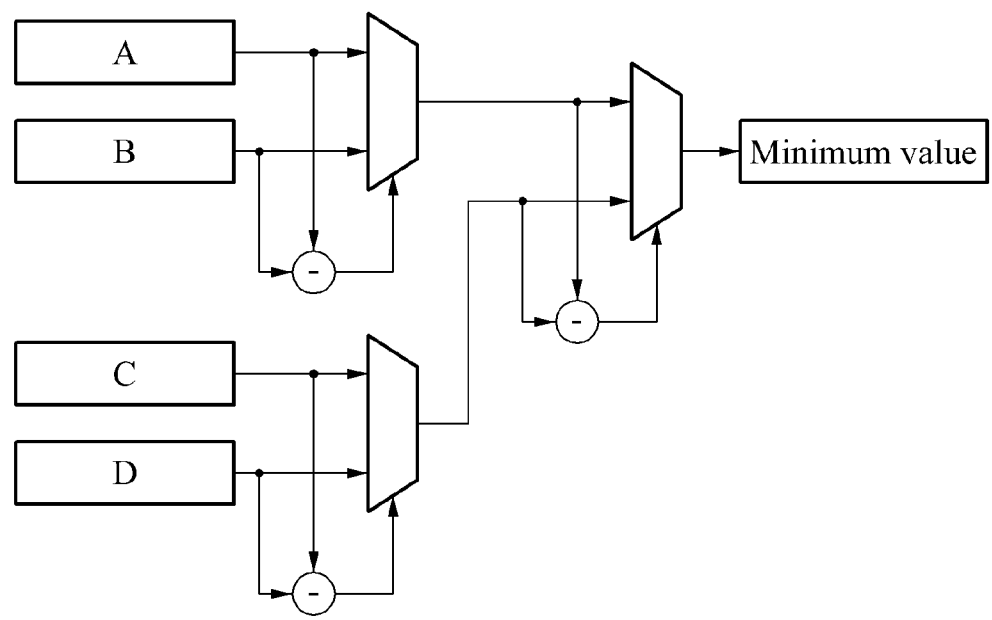
FIG. 1 is a diagram illustrating a configuration of operation blocks for obtaining a maximum value or a minimum value in a digital system according to a conventional art.

Reference will now be made in detail to exemplary embodiments of the present invention, examples of which are illustrated in the accompanying drawings, wherein like reference numerals refer to the like elements throughout. Exemplary embodiments are described below to explain the present invention by referring to the figures.

Figure 2:
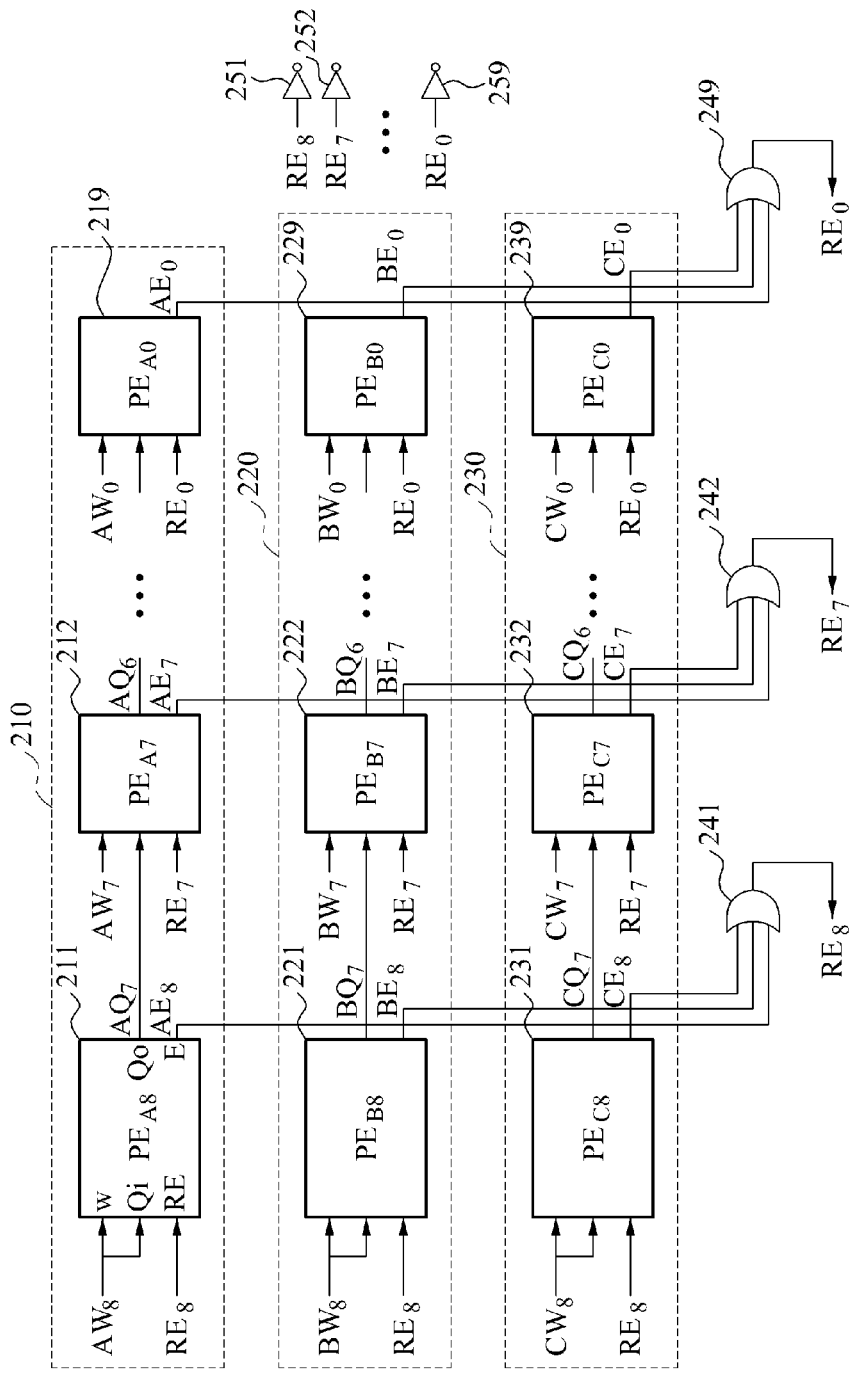
FIG. 2 is a diagram illustrating a configuration of operation blocks for obtaining a maximum value or a minimum value in a plurality of digital signals according to embodiments of the present invention.

FIG. 2 is a diagram illustrating a configuration of operation blocks for obtaining a maximum value or a minimum value in a plurality of digital signals according to embodiments of the present invention.

A configuration of operation blocks for obtaining a minimum value according to embodiments of the present invention may include N×W bit processing elements in which a set signal has N pieces of data, each of which includes W bits, W OR gates, and W inverters.

Referring to FIG. 2, the set signal may correspond to three pieces of data A, B, and C, and each of the three pieces of data may include nine bits, that is, (A: $A_{W8}, \ldots, A_{W0}$), (B: $B_{W8}, \ldots, B_{W0}$), and (C: $C_{W8}, \ldots, C_{W0}$) and thus, the configuration of operation blocks may have a total of 27 bits corresponding to bit processing elements 211,212, . . . ,219,221,222, . . . ,229,231,232, . . . , and 239, respectively.

The configuration of operation blocks may include nine 3-input OR gates 241, 242, . . . , 249 for performing an OR operation for a predetermined value output from each of the bit processing elements, and nine inverters 251, 252, . . . , 259.

Each bit of the data A, B, and C may be connected to a unique bit processing element, that is, the data A is connected to bit processing elements 211, 212, . . . ,219, the data B is connected to bit processing elements 221, 222, . . . , 229, and the data C is connected to bit processing elements 231, 232, . . . ,239. Each bit processing element may have a value Q and a value E corresponding to output values. Here, the value Q may correspond to a state value, and the value E may correspond to an enable value.

An OR operation may be performed on enable signals at the same position, and a resulting value may be input to an RE terminal.

Figure 3:
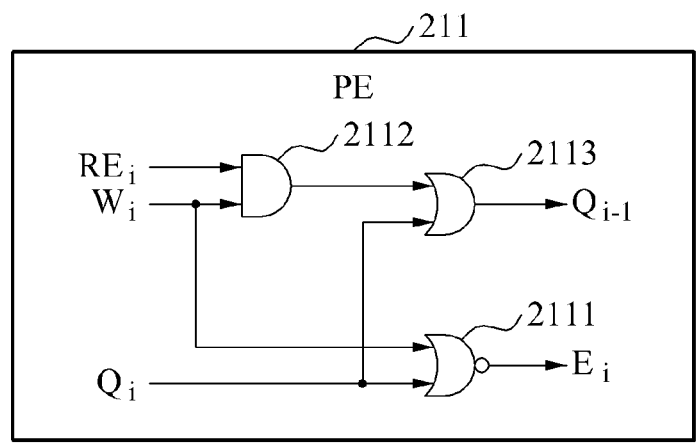
FIG. 3 is a diagram illustrating a configuration of an operation block of a bit processing element receiving an input of a bit of a digital signal in the configuration of the operation block of FIG. 2 according to embodiments of the present invention.

FIG. 3 is a diagram illustrating a configuration of an operation block of a bit processing element receiving an input of a bit of a digital signal in the configuration of the operation block of FIG. 2 according to embodiments of the present invention.

Referring to FIG. 3, a configuration of an operation block of a bit processing element may include an AND gate 2112, an OR gate 2113, and a NOR gate 2111.

In response to signals to be compared concurrently through being connected to bit processing elements, bit processing elements 211, 221, and 231 corresponding to most significant bits may output a value E. Big-OR gates 241, 242, . . . ,249 may perform an OR operation on the value $E_i$ output from each of the bit processing elements, and output a value RE. The output value RE may be input as a value $RE_i$ of the bit processing elements 211, 221, and 231 corresponding to most significant bits $A_{w8}$, $B_{w8}$, and $C_{w8}$, and each of the bit processing elements 211, 221, and 231 may operate and output a value $Q_{i-1}$. The value may be input as a value $Q_i$ of bit processing elements 212, 222, and 232 corresponding to least significant bits $A_{W7}$, $B_{W7}$, and $C_{W7}$.

That is, an operational equation according to the operation block in the bit processing element may be as below.

Herein, "+" denotes an OR bit, "·" denotes am AND bit, and "−" denotes an inversion bit.

$$E_i = \overline{W_i Q_i} = \overline{W_i} + \overline{Q_i} \qquad \text{[Equation 1]}$$

$$Q_{i-1} = RE_i \cdot W_i + Q_i \qquad \text{[Equation 2]}$$

Figure 4:
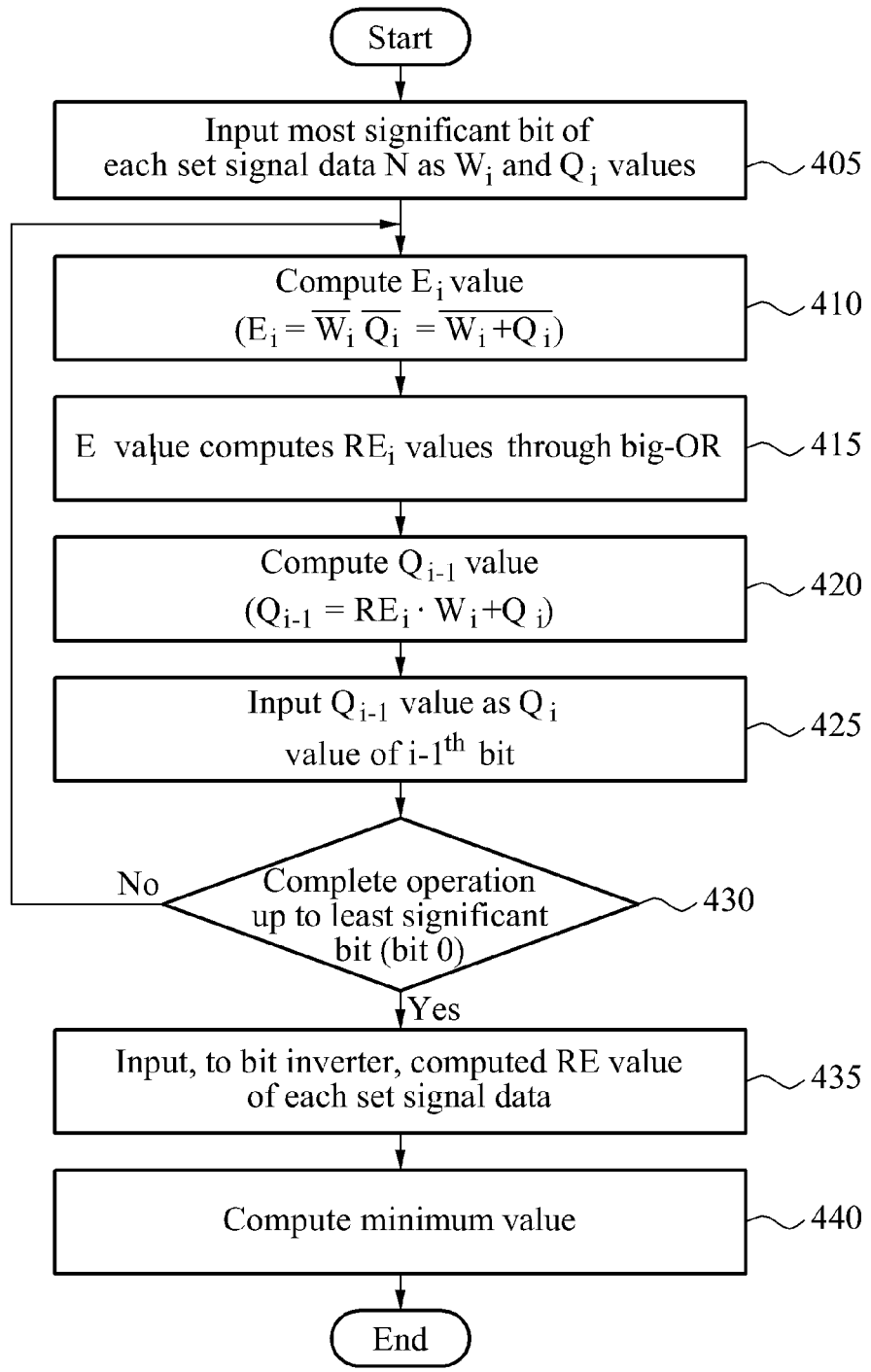
FIG. 4 is a flowchart illustrating an operation for obtaining a minimum value according to embodiments of the present invention.

FIG. 4 is a flowchart illustrating an operation for obtaining a minimum value according to embodiments of the present invention, and FIG. 5 is a diagram illustrating a table of data values output according to an operation for obtaining a minimum value according to embodiments of the present invention.

An operation for obtaining a minimum value according to embodiments of the present invention will be further described with reference to FIG. 4 and FIG. 5.

FIG. 4 and FIG. 5 illustrate an example of obtaining a minimum value from two objects to be compared. Two pieces of data to be compared may correspond to $A(001100010)_2$ and $B(000010111)_2$.

In operation 405, to output a value $Q_7$ and a value $E_7$, "0" corresponding to a most significant value for data A, "0" corresponding to a most significant value for data B may be input, as a value $W_8$, to the bit processing elements 211 and 221 corresponding to most significant bits. A value $Q_{i-1}$ output from a previous bit processing element of an input signal may be input as a value $Q_i$ to output a value However, since the bit processing elements 211 and 221 correspond to most significant bits, and the value $Q_{i-1}$ output from the previous bit processing element is absent, "0" corresponding to a value equivalent to a value $W_i$ may be input.

Thus, in operation 410, the value $E_i$ may be computed based on Equation 1 using the value $W_i$ and the value $Q_i$ input as the most significant bit.

$$E_i = \overline{W_i Q_i} = \overline{W_i} + \overline{Q_i} = 0 + 0 = 1 \qquad \text{[Equation 1]}$$

In operation 415, the value $E_i$ computed in operation 410 may be output as a value $RE_i$ through the 3-input OR gate 241. The value $RE_i$ may correspond to an output value of one of the W OR operators 241, 242, . . . , 249 that performs an OR operation in response to an input of the value Thus, in response to the value $E_i$ being "1," the value $RE_i$ may be "1" resulting from performing an OR operation on "1."

In operation 420, the value $Q_{i-1}$ may be computed based on Equation 2 using the output value $E_i$=1 and the output value $RE_i$=1.

$$Q_{i-1} = RE_i \cdot W_i + Q_i = 1 \cdot 0 + 0 = 0 \qquad \text{[Equation 2]}$$

In operation 425, in response to the value $E_i$ and the value $Q_{i-1}$ being output, "0" corresponding to the output value $Q_{i-1}$ may be input as the value $Q_i$ of the bit processing element 212 corresponding to a least significant bit, that is, an $i-1^{th}$ bit.

In operation 430, it is determined whether an operation of outputting a value computed in each bit processing element is completed up to a least significant bit, that is, bit =0.

In response to an operation in each bit processing element being completed up to the least significant bit for the data A and the data B as a result of determination, the 3-input OR gate may perform an OR operation on the value $E_i$ output from each bit processing element to output an RE value, each output RE value may be input to the inverters 251, 252, . . . , 259 in operation 435, and an inverted bit value may be output in operation 440.

According to embodiments of the present invention, the value $E_i$ output from the bit processing elements for the data A and the data B may correspond to $E_A(110000000)_2$ and $E_B(111101000)_2$. Thus, in response to performing an OR operation on the value $E_i$ at the same bit value position, $E_A+E_B=(111101000)_2$ may be output as the RE value.

In response to the output RE value being input to the inverters 251, 252, . . . , 259 to be inverted, $E_{A+EB}=(000010000)_2$ may be output, and the output value may correspond to the data B and thus, the data B may correspond to a minimum value between the data A and the data B.

As described in the foregoing, to obtain a maximum value/minimum value according to embodiments of the present invention, three gates inside of the bit processing element and a big-OR gate outside of the bit processing element may be used. When the big-OR gate uses a 2-input OR, stages of a 2-input OR gate may be determined based on a number of bits being input.

When a number of data corresponds to M, a 2-input OR gate of $\lceil \log_2^M \rceil$ stages may be used. Thus, the present invention may use a total of $(^{3+\lceil \log_2^M \rceil}) \cdot W$ gate passing time.

When a number of bits W corresponds to 9, and a number of data M corresponds to 4, a time interval used for obtaining a maximum value or a minimum value may correspond to $(3+\log_2^4) \cdot 9$ and thus, a 45 delay time may be used.

When a conventional subtracter is used, three stages of gates may be used to calculate one bit full adder, and $3 \cdot W$ of gate passing time may be used for subtraction of W bits. When a number of input populations corresponds to M, a comparison may be performed through $\lceil \log_2^M \rceil$ stages. Thus, 3 of time interval may be used and thus, for four pieces of data having 9 bits, $3 \cdot 9 \cdot \lceil \log_2^4 \rceil = 54$ of delay time may be used.

Accordingly, embodiments of the present invention may have an effect of easing a delay when compared to a conventional art. The effect of easing a delay may increase as a number of populations increases.

In embodiments of the present invention, an example of obtaining a minimum value among pieces of data to be compared is described. However, an operation of obtaining a maximum value may be performed.

To obtain a maximum value among pieces of data to be compared, each bit input $(A_{W8}, \ldots, A_{W0})$, $B(B_{W8}, \ldots, B_{W0})$, and $C(C_{W8}, \ldots, C_{W0})$ may be inverted through an inverter to be input, and a value output from each bit processing element may pass through a big-OR gate to output values $RE_8, \ldots, RE_0$. The output value may be output without passing through the inverter, and the values $RE_8, \ldots, RE_0$ may correspond to the maximum value among pieces of data to be compared.

The above-described exemplary embodiments of the present invention may be recorded in non-transitory computer-readable media including program instructions to implement various operations embodied by a computer. The media may also include, alone or in combination with the program instructions, data files, data structures, and the like.

Examples of non-transitory computer-readable media include magnetic media such as hard disks, floppy disks, and magnetic tape; optical media such as CD ROM discs and DVDs; magneto-optical media such as optical discs; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of the above-described exemplary embodiments of the present invention, or vice versa.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. An apparatus for obtaining a maximum value or a minimum value from N digital input signals, the apparatus comprising:
   N×W bit processing elements to receive an input of W bits of each of the N digital input signals;
   W OR operators each to receive an input of N operation values output from the bit processing elements, and to perform an OR operation; and
   W inverters to invert an output value for each of the W OR operators.

2. The apparatus of claim 1, wherein each of the bit processing elements comprises:
   a NOR gate to perform a NOR operation on an $i^{th}$ bit value $W_i$ of one of the digital input signals, and a value $Q_i$ corresponding to an output value of an $(i+1)^{th}$ bit processing element that receives an input of an $(i+1)^{th}$ bit value $W_{i+1}$, and to output a value $E_i$ as a result of the NOR operation;
   an AND gate to perform an AND operation on a value $RE_i$ corresponding to an output value of one of the W OR operators that performs an OR operation in response to an input of the value $E_i$ output as a result of the NOR operation, and the $i^{th}$ bit value $W_i$ of the digital input signal; and
   an OR gate to perform an OR operation on the value $Q_i$ and an output value of the AND gate, and output a value $Q_{i-1}$ corresponding to an output value of the OR operation.

3. The apparatus for claim 2, wherein a value $Q_{i-1}$ output from a previous bit processing element is input as the value $Q_i$ input to the NOR gate of a bit processing element that receives an input of an $(i-1)^{th}$ bit value $W_{i-1}$ of the digital input signal.

4. The apparatus for claim 2, wherein, when the bit processing element is a bit processing element corresponding to a most significant bit of the digital input signal, a value equivalent to the $i^{th}$ bit value $W_i$ is input as the value $Q_i$ input to the NOR gate.

5. A method of obtaining a maximum value or a minimum value from N digital input signals, the method comprising:
   receiving an input by each of N×W bit processing elements that receive an input of W bits of each of the N digital input signals;
   outputting a value $Q_{i-1}$ and a value $E_i$ operated in each of the bit processing elements;

performing an OR operation on the value $E_i$ output from the bit processing elements that are at a same position as each of the N digital input signals; and inverting a value obtained as a result of the OR operation.

6. The method of claim 5, wherein the outputting comprises:

outputting the value $E_i$ by performing a NOR operation on an $i^{th}$ bit value $W_i$ of one of the digital input signals, and a value $Q_i$ corresponding to an output value of an $(i+1)^{th}$ bit processing element;

performing an AND operation on a value $RE_i$ output from W OR operators that each perform an OR operation in response to an input of the value $E_i$ output as a result of the NOR operation, and the $i^{th}$ bit value $W_i$ of the digital input signal; and outputting a value $Q_{i-1}$ by performing an OR operation on the value $Q_i$ and an output value resulting from the AND operation.

7. The method of claim 6, wherein a value $Q_{i-1}$ output from a previous bit processing element is input to a NOR operator of a bit processing element that receives an input of an $(i-1)^{th}$ bit value $W_{i-1}$ of the digital input signal.

8. The method of claim 6, wherein, when the bit processing element is a bit processing element corresponding to a most significant bit of the digital input signal, a value equivalent to the $i^{th}$ bit value $W_i$ is input as the value $Q_i$.

9. A method of obtaining a maximum value or a minimum value from N digital input signals, the method comprising:

receiving an input of an inversion of each bit of N×W bit processing elements that receive an input of W bits of each of the N digital input signals;

to outputting a value $Q_{i-1}$ and a value $E_i$ operated in each of the bit processing elements; and performing an OR operation on the value $E_i$ output from the bit processing elements that are at a same position of each of the N digital input signals.

* * * * *